United States Patent
Blay et al.

(10) Patent No.: US 12,362,087 B2
(45) Date of Patent: Jul. 15, 2025

(54) MULTI-LAYER BALANCED-TO-UNBALANCED (BALUN) TRANSMISSION LINE TRANSFORMER WITH HARMONIC REJECTION

(71) Applicant: Intel Corporation, Santa Clara, CA (US)

(72) Inventors: Genadi Blay, BatYam (IL); Uzi Zohar, Ramat Gan (IL); Jacob Solomon, Kiryat-Yam (IL)

(73) Assignee: Intel Corporation, Santa Clara, CA (US)

( * ) Notice: Subject to any disclaimer, the term of this patent is extended or adjusted under 35 U.S.C. 154(b) by 1005 days.

(21) Appl. No.: 17/123,037

(22) Filed: Dec. 15, 2020

(65) Prior Publication Data

US 2022/0189677 A1    Jun. 16, 2022

(51) Int. Cl.
    *H01F 17/00*    (2006.01)
    *H01F 27/28*    (2006.01)
    *H01F 27/32*    (2006.01)
    *H03H 7/42*     (2006.01)
    *H03H 11/32*    (2006.01)

(52) U.S. Cl.
    CPC ....... *H01F 27/2804* (2013.01); *H01F 27/323* (2013.01); *H03H 7/42* (2013.01); *H03H 11/32* (2013.01); *H01F 2027/2809* (2013.01)

(58) Field of Classification Search
    CPC ............... H01F 27/2804; H01F 27/323; H01F 2027/2809; H01F 17/0006; H01F 17/0013; H03H 7/42; H03H 11/32
    See application file for complete search history.

(56) References Cited

U.S. PATENT DOCUMENTS

| | | | |
|---|---|---|---|
| 5,877,667 A | 3/1999 | Wollesen | |
| 6,188,306 B1 | 2/2001 | Wollesen | |
| 6,501,363 B1 * | 12/2002 | Hwu | ................... H01F 27/2804 336/200 |
| 6,784,536 B1 | 8/2004 | Eslamy | |
| 7,176,776 B1 * | 2/2007 | Tantwai | ................ H01P 1/2135 336/200 |
| 7,626,472 B2 * | 12/2009 | Davies-Venn | ......... H05K 1/165 333/185 |
| 7,629,860 B2 * | 12/2009 | Liu | ..................... H01F 17/0013 333/25 |
| 8,344,955 B2 | 1/2013 | Niemi | |

(Continued)

FOREIGN PATENT DOCUMENTS

WO    2015168720    11/2015

*Primary Examiner* — Mang Tin Bik Lian
(74) *Attorney, Agent, or Firm* — Schwegman Lundberg & Woessner, P.A.

(57) ABSTRACT

A balanced-to-unbalanced (balun) transformer includes a primary inductor coupled to an unbalanced terminal and a secondary inductor coupled to a balanced terminal. The primary inductor is configured on a second layer and a third layer of a four-layer symmetrical stack-up. The secondary inductor is configured on a first layer and a fourth layer of the four-layer symmetrical stack-up. The primary inductor includes a first primary winding disposed on the second layer and a second primary winding disposed on the third layer. The secondary inductor includes a first secondary winding disposed on the first layer and a second secondary winding disposed on the fourth layer.

14 Claims, 9 Drawing Sheets

(56) References Cited

U.S. PATENT DOCUMENTS

| | | | |
|---|---|---|---|
| 8,860,195 B2 | 10/2014 | Lam | |
| 2002/0153988 A1* | 10/2002 | Yazaki | H03H 7/42 |
| | | | 336/229 |
| 2004/0119573 A1* | 6/2004 | Lee | H01F 19/04 |
| | | | 336/200 |
| 2006/0061430 A1* | 3/2006 | Lee | H01P 5/10 |
| | | | 333/26 |
| 2007/0057745 A1* | 3/2007 | Ilkov | H05K 1/165 |
| | | | 333/25 |
| 2007/0120637 A1* | 5/2007 | Ezzeddine | H01F 17/0013 |
| | | | 336/200 |
| 2007/0138628 A1 | 6/2007 | Lam | |
| 2008/0197963 A1* | 8/2008 | Muto | H01F 17/0013 |
| | | | 336/200 |
| 2008/0278258 A1* | 11/2008 | Liu | H03H 7/42 |
| | | | 333/25 |
| 2009/0039977 A1* | 2/2009 | Lee | H03H 7/42 |
| | | | 333/25 |
| 2012/0098622 A1* | 4/2012 | Taniguchi | H03H 7/42 |
| | | | 333/25 |
| 2012/0306609 A1* | 12/2012 | Kato | H01F 17/0013 |
| | | | 336/200 |
| 2013/0026846 A1* | 1/2013 | Gianesello | H01F 27/2804 |
| | | | 336/170 |
| 2013/0113300 A1* | 5/2013 | Zybura | H03H 7/0115 |
| | | | 307/105 |
| 2013/0154768 A1* | 6/2013 | Taniguchi | H03H 7/09 |
| | | | 333/185 |
| 2017/0026024 A1* | 1/2017 | Kuribara | H03H 7/42 |
| 2018/0175820 A1* | 6/2018 | Suzuki | H01P 5/10 |

* cited by examiner

މުﾑLTI-LAYER
BALANCED-TO-UNBALANCED (BALUN)
TRANSMISSION LINE TRANSFORMER
WITH HARMONIC REJECTION

TECHNICAL FIELD

Various embodiments generally may relate to the field of radio frequency (RF) signal communication and transmission, including a multi-layer balanced-to-unbalanced (balun) transmission line transformer with harmonic rejection.

BACKGROUND

Wi-Fi and Bluetooth (BT) connectivity solutions commonly use RF signal transformation between balanced and unbalanced signal lines. Existing solutions, however, for RF signal transformation between balanced and unbalanced signal lines are associated with high implementation costs or high path losses.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

Techniques disclosed herein can be used for configuring balun transformer (e.g., a 1:1 such as 50 Ohm to 50 Ohm balun transformer) with low path loss and low implementation cost. The disclosed balun transformer may be used in, e.g., WiFi and BT communication systems using RF transformation (e.g., from balanced to unbalanced signals) with minimum direct path loss in both 2.4 GHz and 5-7 GHz operating bands. More specifically, the disclosed balun transformer may be implemented using a multi-layer (e.g., a four-layer) symmetrical package substrate (around a thick core) which reduces the overall transformer size. Additionally, the disclosed balun also provides tunable harmonic rejection via capacitors (e.g., surface-mount capacitors) coupled to the primary and secondary inductor of the balun transformer.

Figure 1:
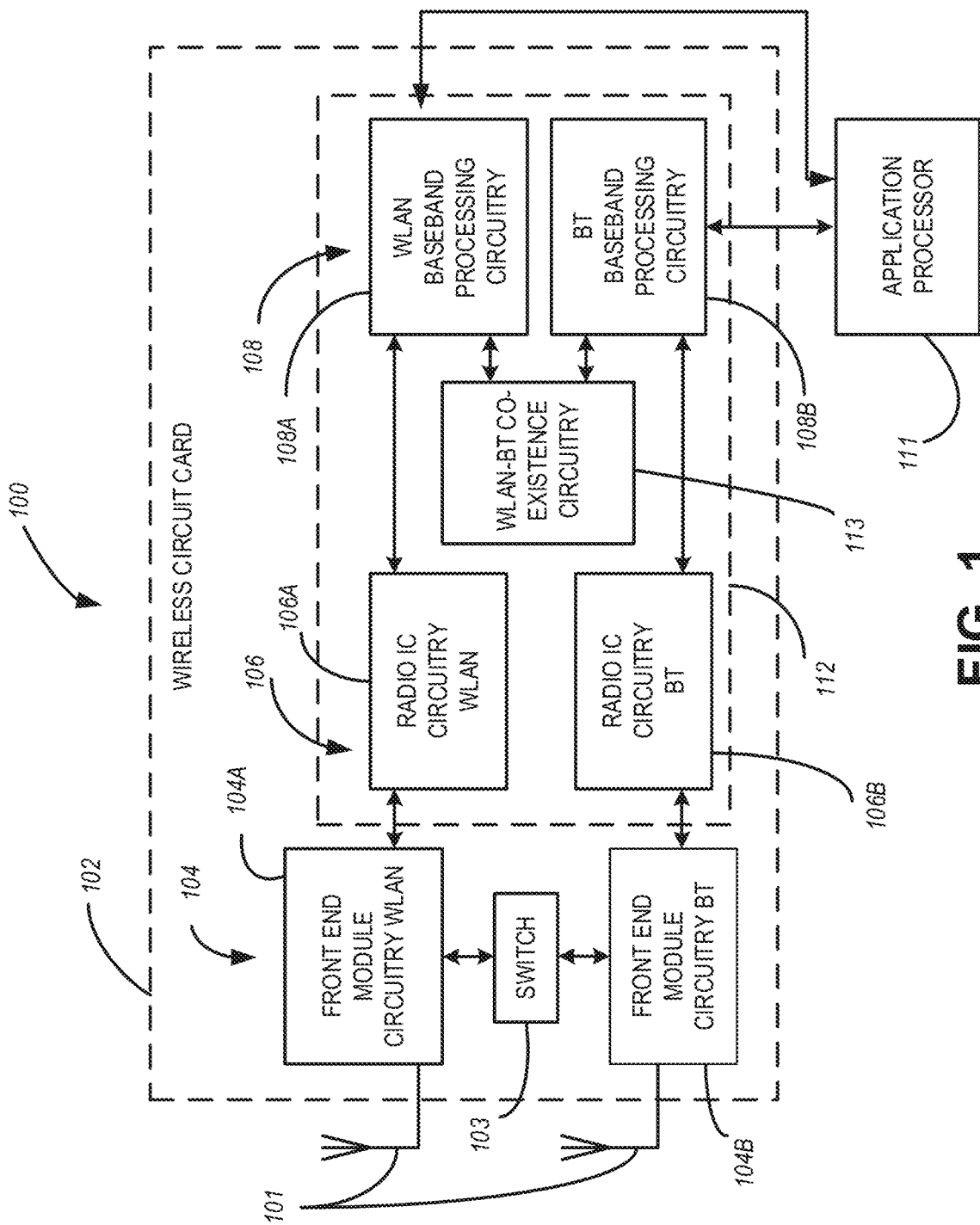
FIG. 1 is a block diagram of a radio architecture, in accordance with some embodiments.

FIG. 1 is a block diagram of a radio architecture 100 in accordance with some embodiments. The radio architecture 100 may be implemented in a computing device including user equipment (UE), a base station (e.g., a next generation Node-B (gNB), enhanced Node-B (eNB)), a smartphone, or another type of wired or wireless device using synthesizer circuitry with frequency estimation. The radio architecture 100 may include radio front-end module (FEM) circuitry 104, radio IC circuitry 106, and baseband processing circuitry 108. Radio architecture 100 as shown includes both Wireless Local Area Network (WLAN) functionality and Bluetooth (BT) functionality although embodiments are not so limited. In this disclosure, "WLAN" and "Wi-Fi" are used interchangeably.

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM 104A and FEM 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the application processor 111 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of one or more antennas as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a single radio card, such as wireless radio card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or integrated circuit (IC), such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the wireless radio card 102 may include a platform controller hub (PCH) system-on-a-chip (SOC) and a central processing unit (CPU)/host SOC.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, and/or 802.11ax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.1 lax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the single wireless radio card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, or 5G communications).

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

Figure 2:
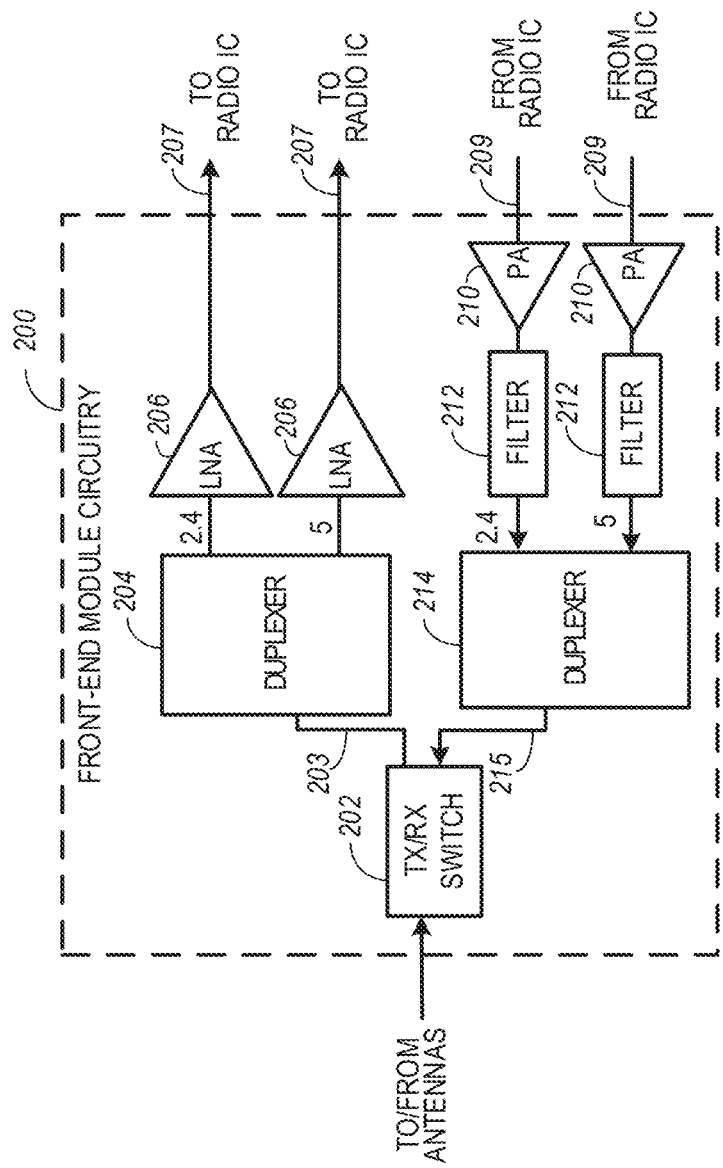
FIG. 2 illustrates a front-end module circuitry for use in the radio architecture of FIG. 1, in accordance with some embodiments.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 (FIG. 1)).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a power amplifier 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

In some aspects, the FEM circuitry 200 may use a balun transformer (e.g., as discussed herein in connection with FIGS. 5-10) implemented using a multi-layer substrate (e.g., a four-layer symmetrical stack-up) with harmonic rejection. In some aspects, the balun transform may be implemented as a transition between balanced and unbalanced communication paths between the FEM circuitry 200 and the one or more antennas 101.

Figure 3:
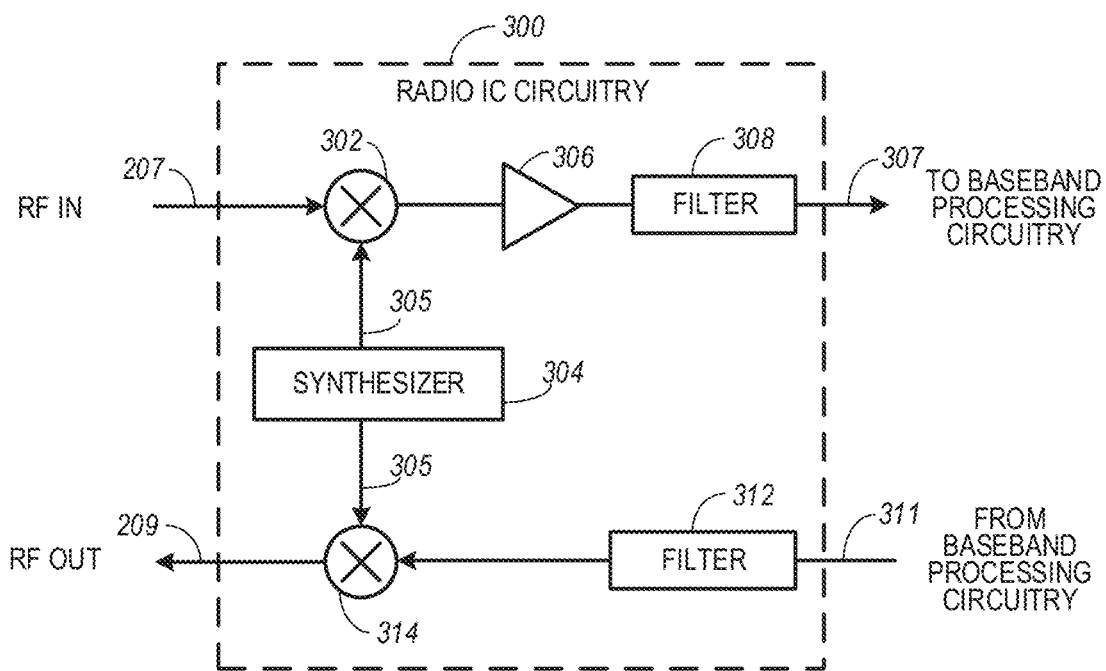
FIG. 3 illustrates a radio IC circuitry for use in the radio architecture of FIG. 1, in accordance with some embodiments.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 320 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 uses one or more of the disclosed techniques for frequency estimation (e.g., the frequency estimation techniques discussed in connection with FIGS. 5-12). In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry, such as the digital frequency synthesizer using the disclosed techniques and discussed in connection with FIG. 5. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage controlled oscillator (VCO), although that is not a requirement. A divider control input may further be provided by either the baseband processing circuitry 108 (FIG. 1) or the application processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 111.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
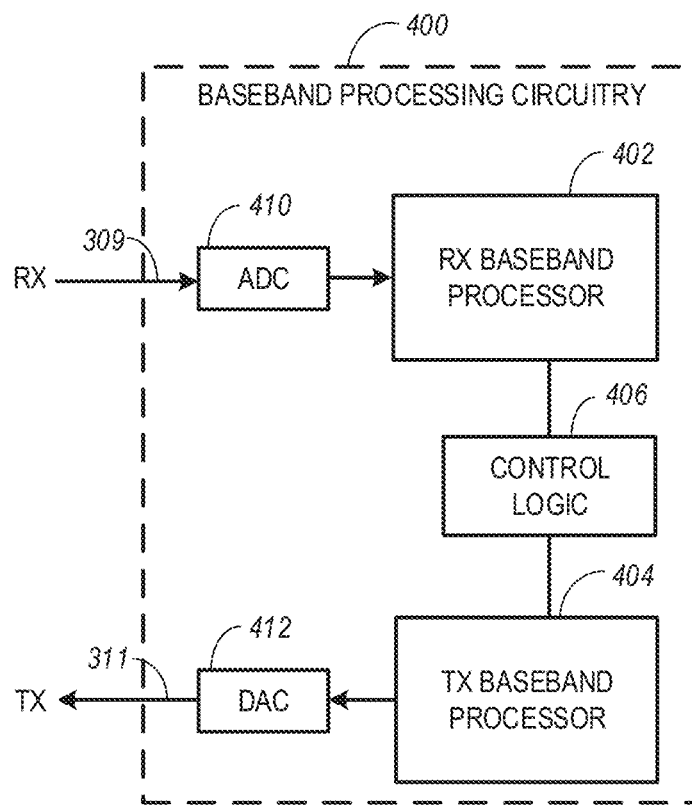
FIG. 4 illustrates a baseband processing circuitry for use in the radio architecture of FIG. 1, in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include ADC 410 to convert analog baseband signals received from the radio IC circuitry 106 to digital baseband signals for processing by the RX BBP 402. In these embodiments, the baseband processing circuitry 400 may also include DAC 412 to convert digital baseband signals from the TX BBP 404 to analog baseband signals.

In some embodiments that communicate OFDM signals or OFDMA signals, such as through the baseband processing circuitry 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

Figure 6:
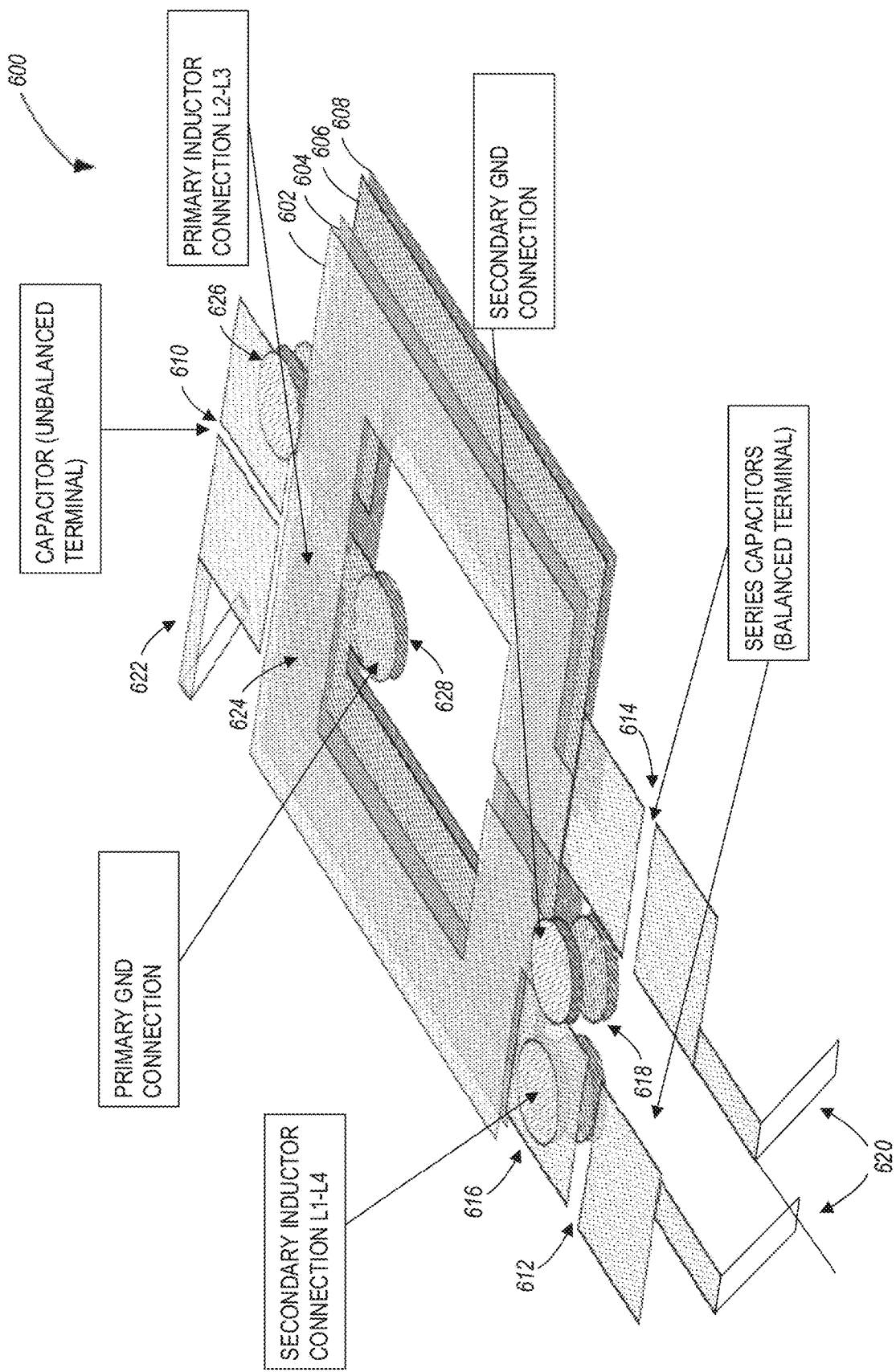
FIG. 6 illustrates a diagram of stacked individual layers of the balun transformer of FIG. 5, in accordance with some embodiments.
Figure 7:
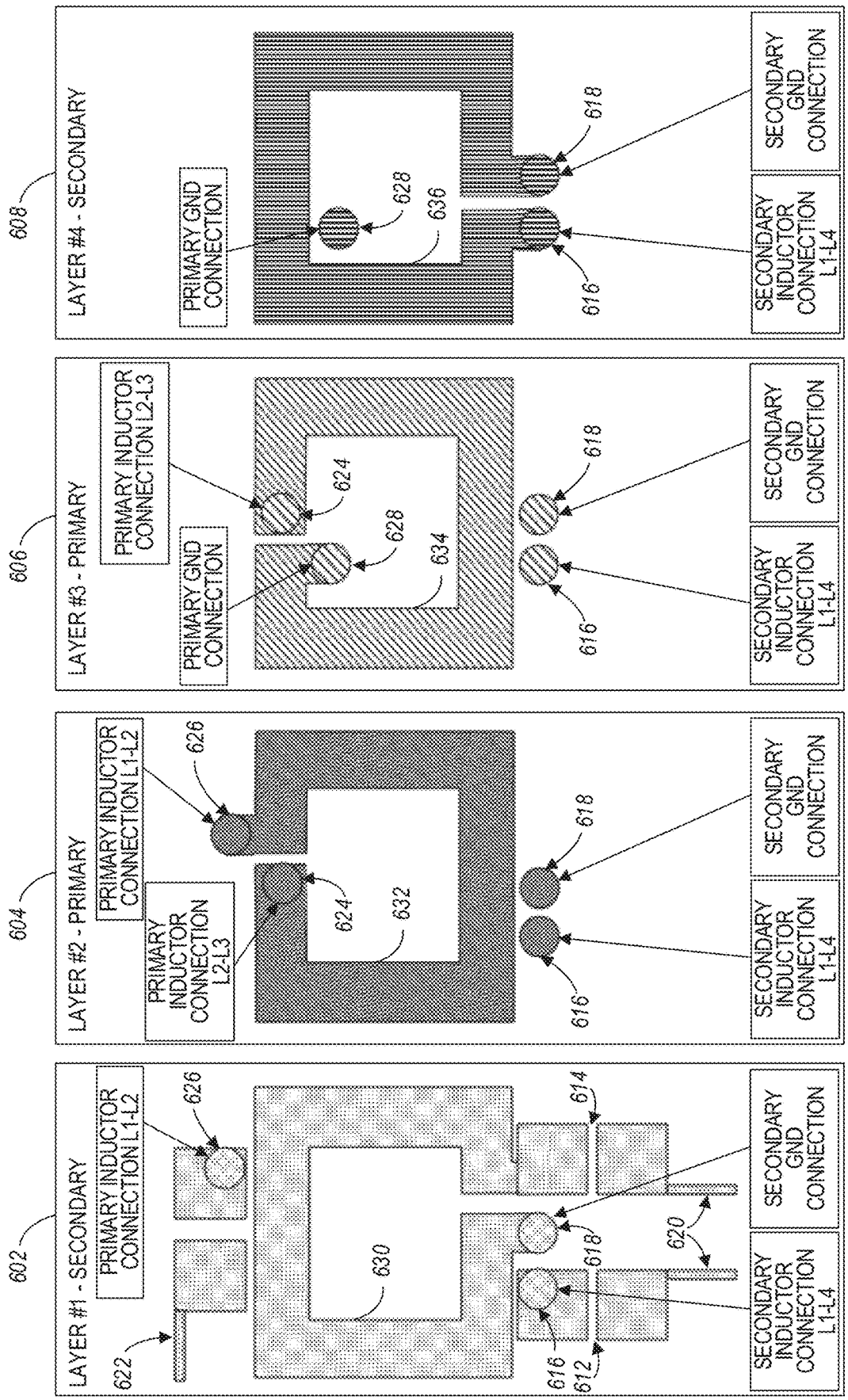
FIG. 7 illustrates a more detailed diagram of the individual layers of the balun transformer of FIG. 5 in unstacked configuration, in accordance with some embodiments.

In some aspects, the disclosed balun transformer may be implemented as a multi-layer (e.g., four-layer) symmetrical stack-up where individual layers can be configured as printed circuit boards (PCBs) with the balun transformer components (e.g., a primary and a secondary inductor where different windings of the inductors are implemented on different layers, as illustrated in FIGS. 6-7), resulting in a printed balun transformer.

Figure 5:
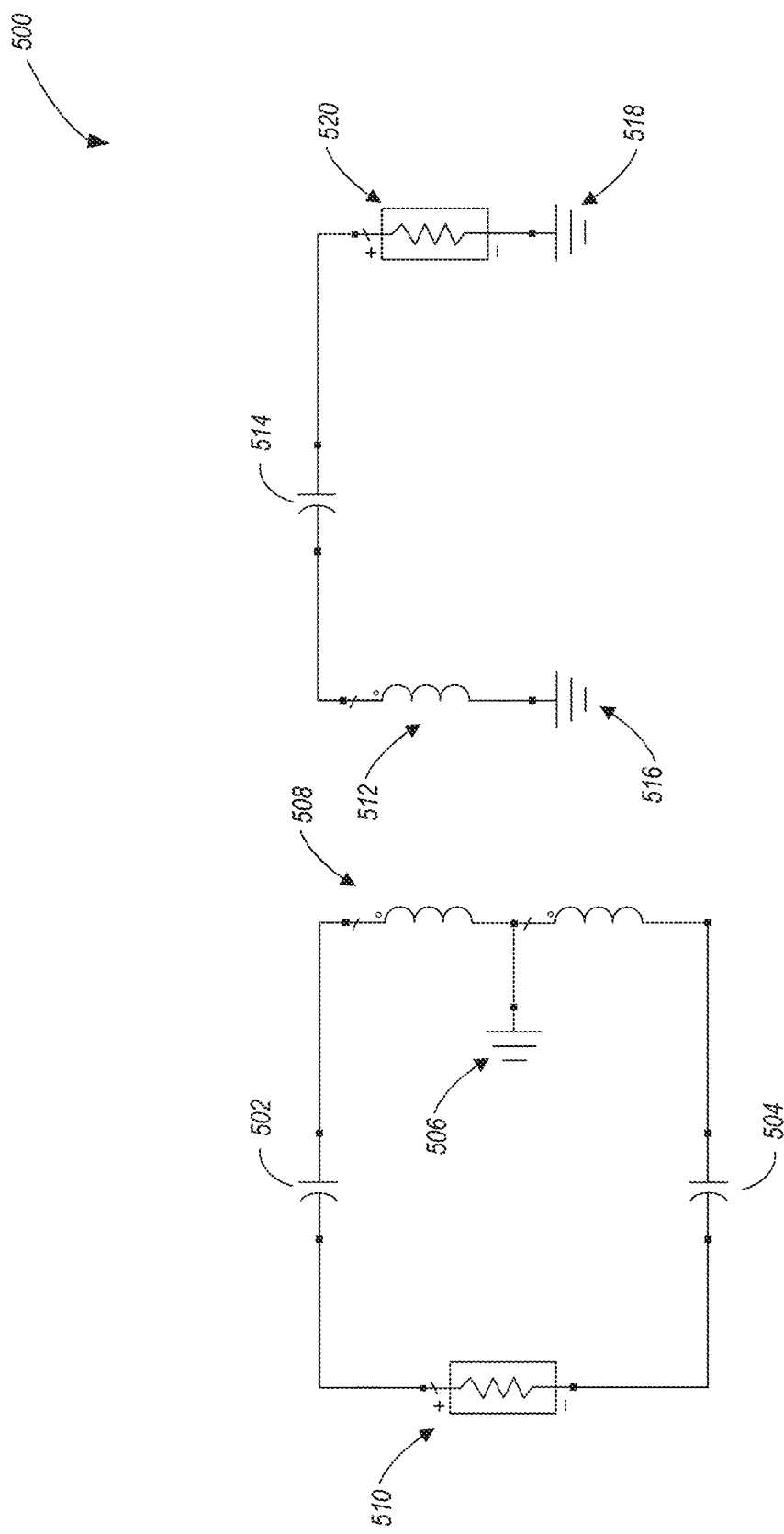
FIG. 5 illustrates a schematic diagram of a balun transformer with harmonic rejection, in accordance with some embodiments.

FIG. 5 illustrates a schematic diagram of a balun transformer 500 with harmonic rejection, in accordance with some embodiments. Referring to FIG. 5, the balun transformer 500 includes a primary inductor 512 coupled to an unbalanced terminal 520 and a secondary inductor 508 coupled to a balanced terminal 510. The unbalanced terminal 520 is coupled to a ground terminal 518 and the primary inductor 512 is coupled to a ground terminal 516. The secondary inductor 508 is coupled to a ground terminal 506. Additionally, the connections of the primary and secondary inductors to the unbalanced and balanced terminals can include one or more capacitors which improve harmonic rejection of the balun transformer 500. For example, the primary inductor 512 is coupled to the unbalanced terminal 520 via the capacitor 514. The secondary inductor 508 is coupled to the balanced terminal 510 via the series capacitors 502 and 504. In an example embodiment, capacitors 502, 504, and 514 can be surface mount (SMT) capacitors or other types of capacitors.

The balun transformer implementation illustrated in FIG. 5 uses mutual inductance of the primary and secondary inductors as well as capacitors for harmonic rejection. In some aspects, the primary and secondary inductors can be implemented as printed inductors to provide the mutual inductance between these inductors. In some aspects, the mutual inductance of printed inductors can be achieved in two ways—either in the X-Y plane (i.e., the inductors are close to each other on the same plane) or in the Z-plane (i.e., the inductors are stacked one above the other). Using the X-Y may be a simpler implementation but implies higher insertion loss due to the low mutual inductance. In some aspects, disclosed techniques for configuring a balun transformer use the Z-plane stack-up. More specifically, the suggested balun transformer implementation modifies the basic concept of using a Z-axis inductance, by using four layers for the transformer inductors/windings in a symmetrical stack-up configuration as illustrated in FIG. 6 in FIG. 7. In this regard, the balun transformer disclosed herein is associated with the following benefits: lower Z-axis height profile and minimized performance impact due to shield proximity; customization and stability (allows custom design for any specific product needs); low path loss with added tunable harmonic rejection via the capacitors; and enables the use of symmetric stack-up around a core.

FIG. 6 illustrates a diagram of a Z-axis (or vertical) stack-up 600 of individual layers of the balun transformer of FIG. 5, in accordance with some embodiments. Referring to FIG. 6, the down transformer 500 can be implemented as stack-up 600 which includes individual layers 602, 604, 606, and 608 which are also referred to as a first layer, a second layer, a third layer, and a fourth layer respectively. FIG. 7 illustrates a more detailed diagram of the individual layers 602-608 of the balun transformer of FIG. 5 in unstacked configuration, in accordance with some embodiments.

Referring to FIG. 5, FIG. 6, and FIG. 7, the primary inductor 512 can be implemented with a first primary winding 632 printed on the second layer 604 and a second primary winding 634 printed on the third layer 606. The secondary inductor 508 can be implemented with a first secondary winding 630 printed on the first layer 602 and a second secondary winding 636 printed on the fourth layer 608. In this regard, the stack-up 600 is configured as a symmetrical stack-up, with each layer being separated from a neighboring layer by a dielectric/isolation layer. In an example embodiment, the isolation layer between layers 604 and 606 has a thickness that is higher than the thickness of the isolation layer between layers 602 and 604 as well as a thickness of the isolation layer between layers 606 and 608.

As illustrated in FIG. 6, the first layer 602 is a top layer of the Z-axis stack-up 600 and the fourth layer 608 is a bottom layer of the stack-up. The first layer 602 further includes the unbalanced terminal 622 and the balanced terminal 620. The first primary winding 632 and the second primary winding 634 are coupled using a first primary inductor connection 624. The first primary inductor connection 624 includes a via between the second layer 604 and the third layer 606. The first primary winding 632 is coupled to the unbalanced terminal 622 using a second primary inductor connection 626. The second primary inductor connection 626 includes a via between the first layer 602 and the second layer 604. The second primary winding 634 is coupled to ground (e.g., ground terminal 516) using a primary ground connection 628. The primary ground connection 628 includes a via between the third layer 606 and the fourth layer 608.

The secondary inductor includes a first secondary winding 630 disposed on the first layer 602 and a second secondary winding 636 disposed on the fourth layer 608. The first secondary winding 630 and the second secondary winding 636 are coupled using a secondary inductor connection 616. The secondary inductor connection 616 includes a first via between the first layer 602, the second layer 604, the third layer 606, and the fourth layer 608. The first secondary winding 630 and the second secondary winding 636 are further coupled to ground using a secondary ground connection 618. The secondary ground connection 618 includes a second via between the first layer 602, the second layer 604, the third layer 606, and the fourth layer 608. The second secondary winding 636 is coupled to the balanced terminal 620 via the secondary inductor connection 616.

The balanced terminal 620 and the unbalanced terminal 622 are disposed on the first layer 602. The unbalanced terminal 622 is coupled to the primary inductor using a via between the first layer 602 and the second layer 604. The balanced terminal 620 is coupled to the secondary inductor 508 (with windings 630 and 636) using a via between the first layer 602, the second layer 604, the third layer 606, and the fourth layer 608.

In some aspects, the primary inductor 512 (including windings 632 and 634) is coupled to the unbalanced terminal 622 (which is the same as unbalanced terminal 520) via a capacitor 610 (which is the same as capacitor 514). The secondary inductor 508 (including windings 630 and 636) is coupled to the balanced terminal 620 (which is the same as balanced terminal 510) via a set of series capacitors 612 and 614 (which are the same as capacitors 502 and 504).

Figure 8:
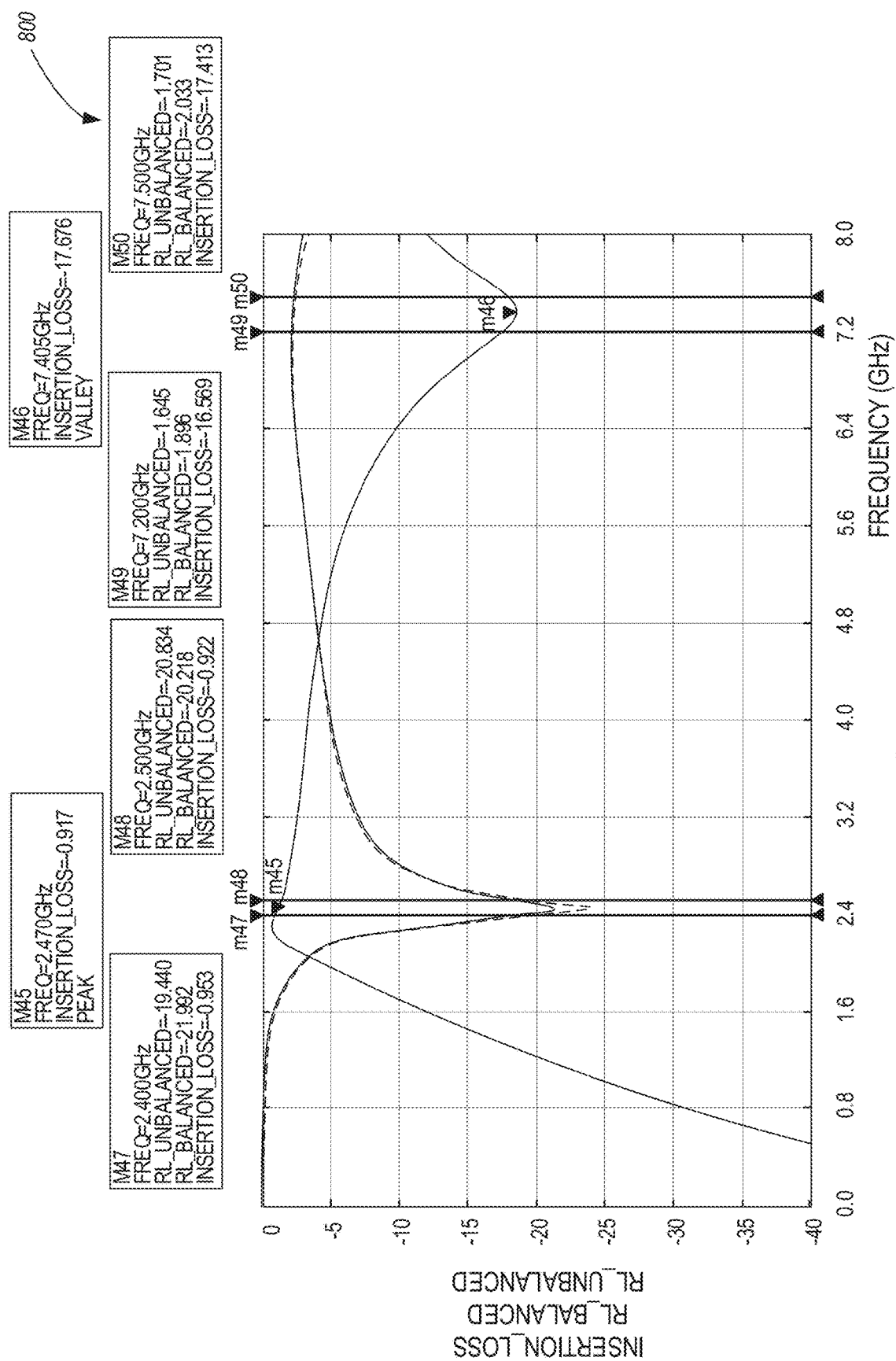
FIG. 8 illustrates a graph of return loss and insertion loss simulation results for the balun transformer of FIG. 5, in accordance with some embodiments.

FIG. 8 illustrates graph 800 of return loss and insertion loss simulation results for the balun transformer of FIG. 5, in accordance with some embodiments. More specifically, FIG. 8 shows the simulation results of the suggested balun transformer structure of FIGS. 5-6 using three SMT capacitors in the relevant places (e.g., as capacitors 502, 504, and 514). In some aspects, the resonance frequency can be tuned by changing the size of the stack-up structure (e.g., the distance between layers, area of the windings on each layer, etc.).

In some aspects, harmonic rejection can be achieved by tuning the width of the inductors. In the suggested solution associated with FIG. 8, ~17 dB rejection was implemented for the 3rd harmonic (7.2 GHz-7.5 GHz). In some aspects, insertion loss is reduced to ~0.9 dB in the passband. In some aspects, X-Y LB transformation applies ~2.5 dB insertion loss with similar size. In some aspects, a return loss of ~−20 dB was achieved in the relevant frequency band. In some aspects, a suggested transformer solution size can be 1 mm×0.8 mm without the added capacitors. In some aspects, the full solution size can be 1 mm×1.66 mm, with both inductor's width being 160 um to achieve the 3rd harmonic rejection.

Figure 9:
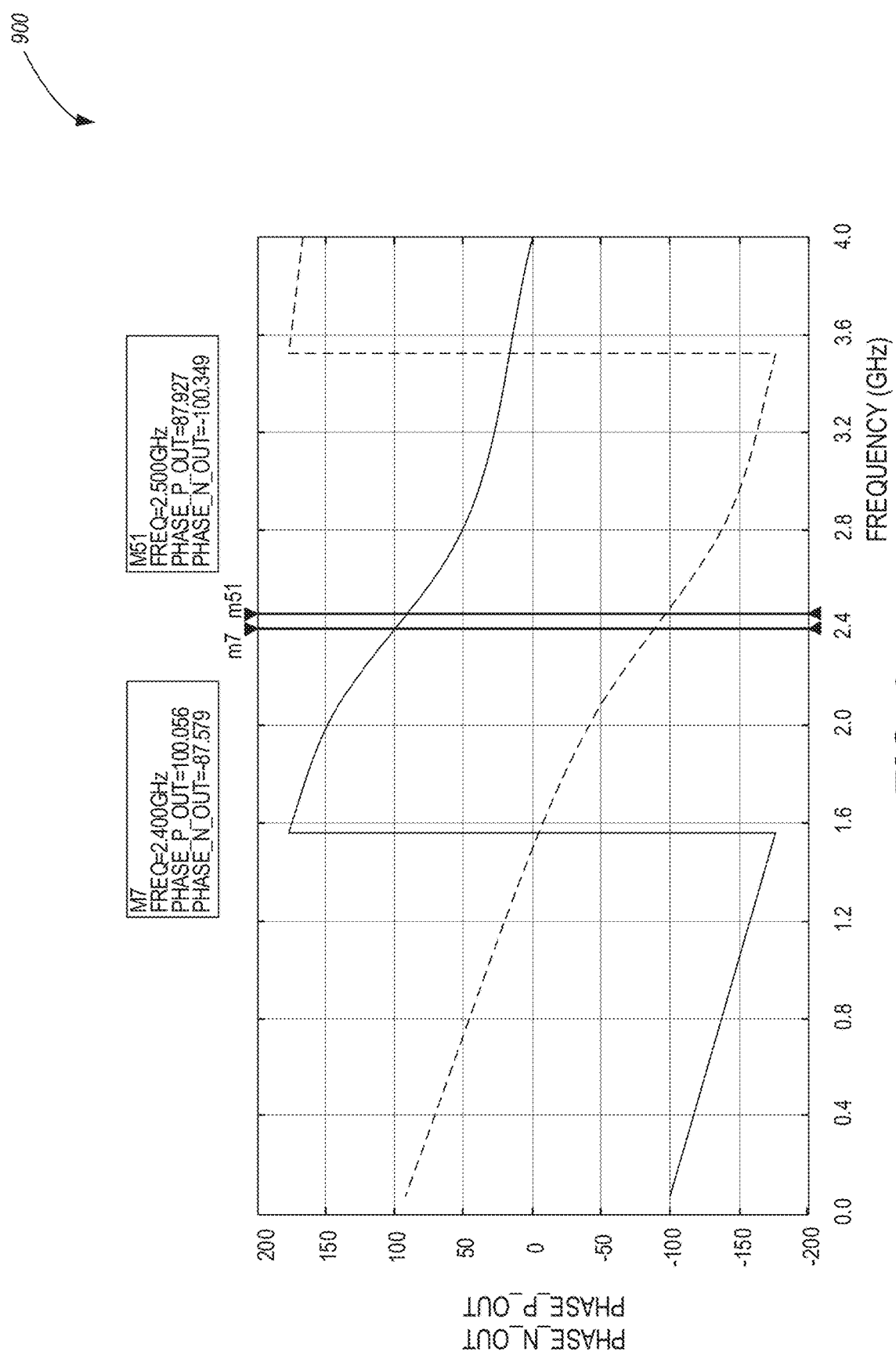
FIG. 9 illustrates a graph of phase difference simulation results for the balun transformer of FIG. 5, in accordance with some embodiments.

FIG. 9 illustrates graph 900 of phase difference simulation results for the balun transformer of FIG. 5, in accordance with some embodiments. More specifically, FIG. 9 illustrates the phase difference from the differential inputs to the output. In some aspects, a 187-degree phase difference is achieved in the suggested solution. In some aspects, additional phase tuning can be done by shifting the primary inductor GND connection.

Figure 10:
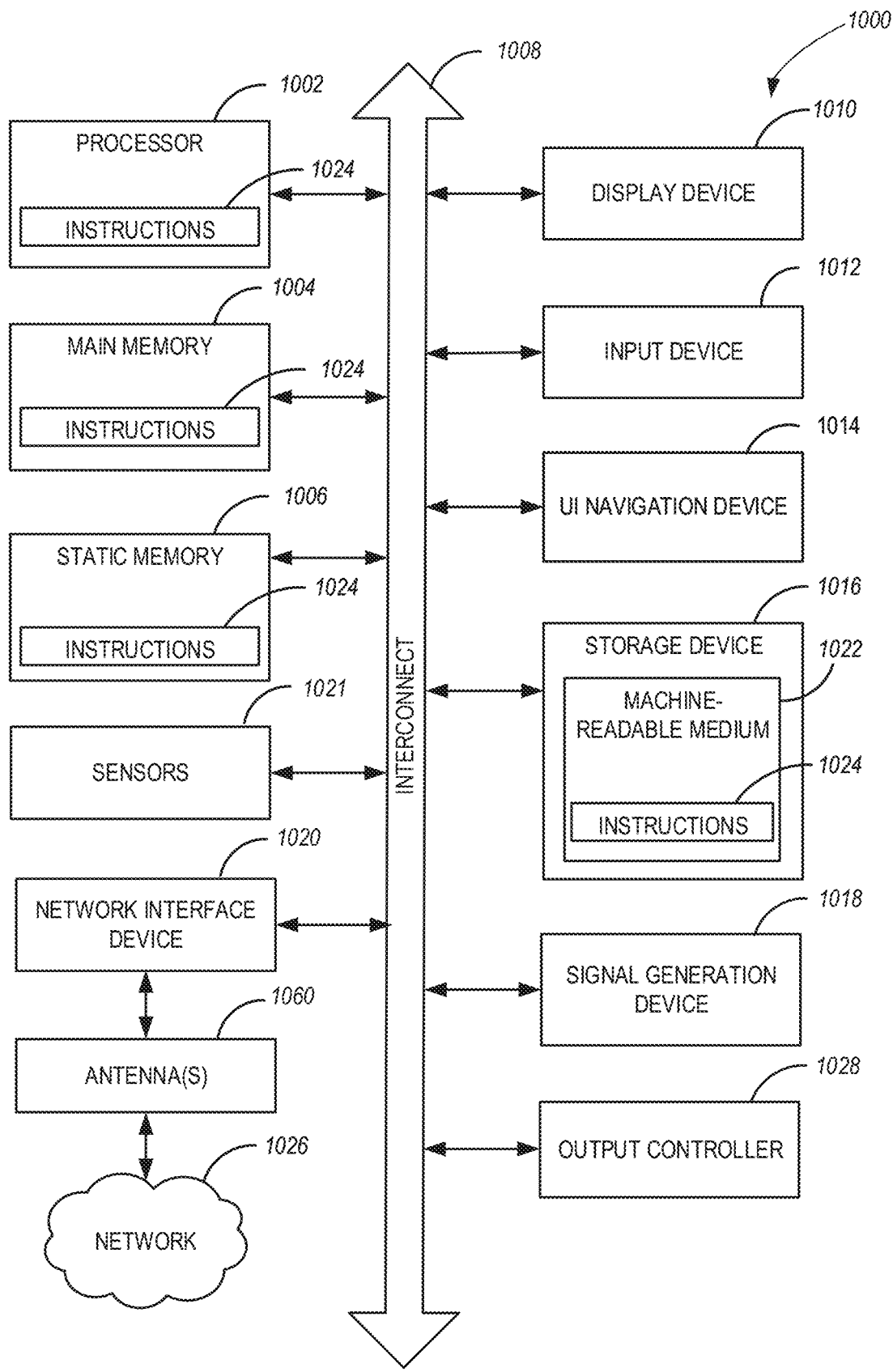
FIG. 10 illustrates a block diagram of an example machine upon which any one or more of the operations/techniques (e.g., methodologies) discussed herein may perform.

FIG. 10 illustrates a block diagram of an example machine 1000 upon which any one or more of the techniques (e.g., methodologies) discussed herein may perform. In alternative embodiments, the machine 1000 may operate as a standalone device or may be connected (e.g., networked) to other machines. In a networked deployment, machine 1000 may operate in the capacity of a server machine, a client machine, or both in server-client network environments. In an example, the machine 1000 may act as a peer machine in a peer-to-peer (P2P) (or other distributed) network environment. The machine 1000 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 1000 may include a hardware processor 1002 (e.g., a central processing unit (CPU), a graphics processing unit (GPU), a hardware processor core, or any combination thereof), a main memory 1004, and a static memory 1006, some or all of which may communicate with each other via an interlink (e.g., bus) 1008.

Specific examples of main memory 1004 include Random Access Memory (RAM), and semiconductor memory devices, which may include, in some embodiments, storage locations in semiconductors such as registers. Specific examples of static memory 1006 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM; and CD-ROM and DVD-ROM disks.

The machine 1000 may further include a display device 1010, an input device 1012 (e.g., a keyboard), and a user interface (UI) navigation device 1014 (e.g., a mouse). In an example, the display device 1010, input device 1012, and UI navigation device 1014 may be a touch screen display. The machine 1000 may additionally include a storage device (e.g., drive unit or another mass storage device) 1016, a signal generation device 1018 (e.g., a speaker), a network interface device 1020, and one or more sensors 1021, such as a global positioning system (GPS) sensor, compass, accelerometer, or other sensors. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, the processor 1002 and/or instructions 1024 may comprise processing circuitry and/or transceiver circuitry.

The storage device 1016 may include a machine-readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the storage device 1016 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 1022 is illustrated as a single medium, the term "machine-readable medium" may include a single medium or multiple media (e.g., a centralized or distributed database, and/or associated caches and servers) configured to store one or more instructions 1024.

An apparatus of the machine 1000 may be one or more of a hardware processor 1002 (e.g., a central processing unit (CPU), a graphics processing unit (GPU), a hardware processor core, or any combination thereof), a main memory 1004 and a static memory 1006, one or more sensors 1021, a network interface device 1020, antennas 1060, a display device 1010, an input device 1012, a UI navigation device 1014, a storage device 1016, instructions 1024, a signal generation device 1018, and an output controller 1028. The apparatus may be configured to perform one or more of the methods and/or operations disclosed herein. The apparatus may be intended as a component of the machine 1000 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 1024 may further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 1020 may include one or more physical jacks (e.g., Ethernet, coaxial, or phone jacks) or one or more antennas to connect to the communications network 1026. In an example, the network interface device 1020 may include one or more antennas 1060 to wirelessly communicate using at least one of single-input multiple-output (SIMO), multiple-input multiple-output (MIMO), or multiple-input single-output (MISO) techniques. In some examples, the network interface device 1020 may wirelessly communicate using Multiple User MIMO techniques. The term "transmission medium" shall be taken to include any intangible medium that is capable of storing, encoding, or carrying instructions for execution by the machine 1000, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media; optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $1/10$ of a wavelength or more.

Additional Notes and Examples

Example 1 is a balanced-to-unbalanced (balun) transformer comprising: a primary inductor coupled to an unbalanced terminal; and a secondary inductor coupled to a balanced terminal; wherein: the primary inductor is configured on a second layer and a third layer of a four-layer symmetrical stack-up, and the secondary inductor is configured on a first layer and a fourth layer of the four-layer symmetrical stack-up.

In Example 2, the subject matter of Example 1 includes, wherein the primary inductor comprises: a first primary winding disposed on the second layer; and a second primary winding disposed on the third layer.

In Example 3, the subject matter of Example 2 includes, wherein the first primary winding and the second primary winding are coupled using a first primary inductor connection, the first primary inductor connection comprising a via between the second layer and the third layer.

In Example 4, the subject matter of Example 3 includes, wherein the first primary winding is coupled to the unbalanced terminal using a second primary inductor connection, the second primary inductor connection comprising a via between the first layer and the second layer.

In Example 5, the subject matter of Examples 2-4 includes, wherein the second primary winding is coupled to ground using a primary ground connection.

In Example 6, the subject matter of Example 5 includes, wherein the primary ground connection comprises a via between the third layer and the fourth layer.

In Example 7, the subject matter of Examples 2-6 includes, wherein the secondary inductor comprises: a first secondary winding disposed on the first layer; and a second secondary winding disposed on the fourth layer.

In Example 8, the subject matter of Example 7 includes, wherein the first secondary winding and the second secondary winding are coupled using a secondary inductor connection, the secondary inductor connection comprising a first via between the first layer, the second layer, the third layer, and the fourth layer.

In Example 9, the subject matter of Example 8 includes, wherein the first secondary winding and the second secondary winding are further coupled to ground using a secondary ground connection.

In Example 10, the subject matter of Example 9 includes, wherein the secondary ground connection comprises a second via between the first layer, the second layer, the third layer, and the fourth layer.

In Example 11, the subject matter of Examples 8-10 includes, wherein the second secondary winding is coupled to the balanced terminal via the secondary inductor connection.

In Example 12, the subject matter of Examples 1-11 includes, wherein the balanced terminal and the unbalanced terminal are disposed on the first layer, wherein the unbalanced terminal is coupled to the primary inductor using a first via between the first layer and the second layer, and wherein the balanced terminal is coupled to the secondary inductor using a second via between the first layer, the second layer, the third layer, and the fourth layer.

In Example 13, the subject matter of Examples 1-12 includes, wherein the primary inductor is coupled to the unbalanced terminal via a capacitor.

In Example 14, the subject matter of Examples 1-13 includes, wherein the secondary inductor is coupled to the balanced terminal via a set of series capacitors.

Example 15 is an integrated circuit with a multi-layer symmetrical package substrate, the circuit comprising: a first inductor coupled to an unbalanced terminal via a capacitor; and a second inductor coupled to a balanced terminal via a set of series capacitors; wherein: the first inductor comprises a first plurality of windings disposed on a first set of layers of the multi-layer substrate, the second inductor comprises a second plurality of windings disposed on a second set of layers of the multi-layer substrate, and the first set of layers and the second set of layers are symmetrically stacked along a vertical (Z) axis.

In Example 16, the subject matter of Example 15 includes, wherein the multi-layer substrate comprises four layers, and wherein the first inductor comprises a first winding and a second winding, the first and second windings disposed respectively on neighboring layers of the multi-layer substrate.

In Example 17, the subject matter of Example 16 includes, wherein the second inductor comprises a third winding and a fourth winding, the third and fourth windings disposed respectively on non-neighboring layers of the multi-layer substrate.

In Example 18, the subject matter of Example 17 includes, wherein: the third winding is printed on a first layer of the multi-layer substrate; the first winding is printed on a second layer of the multi-layer substrate; the second winding is printed on a third layer of the multi-layer substrate; the fourth winding is printed on a fourth layer of the multi-layer substrate; and the first layer is a top layer of the multi-layer substrate, the top layer further including the unbalanced terminal and the balanced terminal.

In Example 19, the subject matter of Example 18 includes, a dielectric layer between each pair of neighboring layers of the multi-layer substrate.

In Example 20, the subject matter of Example 19 includes, wherein a thickness of the dielectric layer between the second and third layers of the multi-layer substrate is larger than a thickness of the dielectric layer between the first and second layers or a thickness of the dielectric layer between the third and fourth layers of the multi-layer substrate.

Example 21 is an apparatus comprising: one or more antennas; and front-end circuitry communicatively coupled to the one or more antennas via a balanced-to-unbalanced (balun) transformer, the balun transformer comprising: a primary inductor coupled to an unbalanced terminal of the front-end circuitry; and a secondary inductor coupled to a balanced terminal of the front-end circuitry; wherein: the primary inductor is configured on a second layer and a third layer of a four-layer symmetrical stack-up, and the secondary inductor is configured on a first layer and a fourth layer of the four-layer symmetrical stack-up.

In Example 22, the subject matter of Example 21 includes, wherein: the primary inductor comprises a first primary winding disposed on the second layer and a second primary winding disposed on the third layer; the first primary winding and the second primary winding are coupled using a first primary inductor connection, the first primary inductor connection comprising a via between the second layer and the third layer; the first primary winding is coupled to the unbalanced terminal using a second primary inductor connection, the second primary inductor connection comprising a via between the first layer and the second layer; and the second primary winding is coupled to ground using a primary ground connection, the primary ground connection comprises a via between the third layer and the fourth layer.

In Example 23, the subject matter of Example 22 includes, wherein: the secondary inductor comprises a first secondary winding disposed on the first layer and a second secondary winding disposed on the fourth layer; the first secondary winding and the second secondary winding are coupled using a secondary inductor connection, the secondary inductor connection comprising a first via between the first layer, the second layer, the third layer, and the fourth layer; and the first secondary winding and the second secondary winding are further coupled to ground using a secondary ground connection.

Example 24 is at least one machine-readable medium including instructions that, when executed by processing circuitry, cause the processing circuitry to perform operations to implement of any of Examples 1-23.

Example 25 is an apparatus comprising means to implement of any of Examples 1-23.

Example 26 is a system to implement of any of Examples 1-23.

Example 27 is a method to implement of any of Examples 1-23.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. A balanced-to-unbalanced (balun) transformer comprising:
a primary inductor coupled to an unbalanced terminal and comprising a plurality of primary windings; and
a secondary inductor coupled to a balanced terminal and comprising a plurality of secondary windings;
wherein:
the primary inductor is configured on a second layer and a third layer of a four-layer symmetrical stack-up, the secondary inductor is configured on a first layer and a fourth layer of the four-layer symmetrical stack-up, the four-layer symmetrical stack-up comprising a plurality of connection vias, a first connection via of the plurality of connection vias coupling the first layer and the fourth layer to a ground terminal, a second connection via of the plurality of connection vias coupling the third layer to the ground terminal, the second connection via configured within a void formed by the plurality of secondary windings, and the first connection via configured externally to the void formed by the plurality of secondary windings.

2. The balun transformer of claim 1, wherein the primary inductor comprises:
a first primary winding of the plurality of primary windings disposed on the second layer; and
a second primary winding of the plurality of primary windings disposed on the third layer.

3. The balun transformer of claim 2, wherein the first primary winding and the second primary winding are coupled using a first primary inductor connection, the first primary inductor connection comprising a via between the second layer and the third layer.

4. The balun transformer of claim 3, wherein the first primary winding is coupled to the unbalanced terminal using a second primary inductor connection, the second primary inductor connection comprising a via between the first layer and the second layer.

5. The balun transformer of claim 2, wherein the second primary winding is coupled to the ground terminal using a primary ground connection.

6. The balun transformer of claim 5, wherein the primary ground connection comprises a via between the third layer and the fourth layer.

7. The balun transformer of claim 2, wherein the secondary inductor comprises:
 a first secondary winding of the plurality of secondary windings disposed on the first layer; and
 a second secondary winding of the plurality of secondary windings disposed on the fourth layer.

8. The balun transformer of claim 7, wherein the first secondary winding and the second secondary winding are coupled using a secondary inductor connection, the secondary inductor connection comprising a first via, the first via coupling the first layer, the second layer, the third layer, and the fourth layer.

9. The balun transformer of claim 8, wherein the first secondary winding and the second secondary winding are further coupled to the ground terminal using a secondary ground connection.

10. The balun transformer of claim 9, wherein the secondary ground connection comprises a second via, the second via coupling the first layer, the second layer, the third layer, and the fourth layer.

11. The balun transformer of claim 8, wherein the second secondary winding is coupled to the balanced terminal using the secondary inductor connection.

12. The balun transformer of claim 1, wherein the balanced terminal and the unbalanced terminal are disposed on the first layer, wherein the unbalanced terminal is coupled to the primary inductor using a first via between the first layer and the second layer, and wherein the balanced terminal is coupled to the secondary inductor using a second via between the first layer, the second layer, the third layer, and the fourth layer.

13. The balun transformer of claim 1, wherein the primary inductor is coupled to the unbalanced terminal using a capacitor.

14. The balun transformer of claim 1, wherein the secondary inductor is coupled to the balanced terminal using a set of series capacitors.

* * * * *